(12) United States Patent
Sakai et al.

(10) Patent No.: US 7,454,832 B2
(45) Date of Patent: Nov. 25, 2008

(54) METHOD OF FORMING METAL PLATE PATTERN AND CIRCUIT BOARD

(75) Inventors: Toyoaki Sakai, Nagano (JP); Katsuya Fukase, Nagano (JP)

(73) Assignee: Shinko Electric Industries Co., Ltd. (JP)

( * ) Notice: Subject to any disclaimer, the term of this patent is extended or adjusted under 35 U.S.C. 154(b) by 102 days.

(21) Appl. No.: 11/506,589

(22) Filed: Aug. 18, 2006

(65) Prior Publication Data

US 2007/0042585 A1  Feb. 22, 2007

(30) Foreign Application Priority Data

Aug. 18, 2005 (JP) .............................. 2005-237467

(51) Int. Cl.
*H05K 3/02* (2006.01)
(52) U.S. Cl. .............................. 29/846; 29/825; 29/874; 438/612; 438/616
(58) Field of Classification Search ............... 29/825, 29/827, 846, 847, 874
See application file for complete search history.

(56) References Cited

U.S. PATENT DOCUMENTS 5,466,540 A * 11/1995 Pai et al. .................... 428/614
6,528,874 B1 * 3/2003 Iijima et al. ................. 257/700
6,828,221 B2 * 12/2004 Iijima et al. ................. 438/616
7,096,578 B2 * 8/2006 Iijima et al. .................. 29/830

FOREIGN PATENT DOCUMENTS

| JP | 1-188700 | 7/1989 |
|----|----------|--------|
| JP | 1-290289 | 11/1989 |
| JP | 10-229153 | 8/1998 |
| JP | 2004-204251 | 7/2004 |
| JP | 2005-26646 | 1/2005 |

* cited by examiner

*Primary Examiner*—C. J Arbes
(74) *Attorney, Agent, or Firm*—Walter G. Hanchuk; Chadbourne & Parke LLP

(57) ABSTRACT

A method of forming a high aspect ratio metal plate pattern or circuit board by multi-stage etching with a metal mask is disclosed. A resist (12) is coated on one or two surfaces of a copper plate (10) and patterned into a resist pattern. A tin plating layer (14) is formed using this resist pattern, and with this tin plating layer as a mask, the copper plate is half etched. By coating, exposing and developing the positive resist (18), the positive resist under the tin plating layer is protected. With the tin plating layer and the protective resist layer as a mask, the half etching is executed again. This process is repeated until the resist and the tin plating layer used as a masking are finally removed to produce a metal pattern (20).

14 Claims, 12 Drawing Sheets

ETCHE A PLURALITY OF TIMES
AND REMOVE POSITIVE RESIST

PROCESS OF ELECTROLYTIC POLISHING (a)  (b)  (c)

AFTER ELECTROLYTIC POLISHING

METHOD OF FORMING METAL PLATE PATTERN AND CIRCUIT BOARD

BACKGROUND OF THE INVENTION

1. Field of the Invention

This invention relates to a method of forming a metal plate pattern, such as a lead frame or a metal mask mesh or a wiring pattern on a printed circuit board, or, in particular, to a method of forming a high aspect ratio fine metal plate pattern, such a lead frame or a metal mask mesh, from a metal plate using semiadditive process pattern forming technique or a method of forming a fine wiring pattern on an insulating substrate to fabricate a printed circuit board.

2. Description of the Related Art

The subtractive process is an inexpensive, simple method of fabricating a printed circuit board and has been most widely used. on the other hand, the recent trend toward a higher density and a smaller size of semiconductor devices and various electronic devices, the subtractive method is disadvantageous in some points when producing fine conductor patterns on a circuit board.

A method of forming a metal pattern has been proposed in which the etching process is provisionally suspended after being etched to a predetermined depth along the thickness of an etched layer and the side etched portion generated by the first etching session is covered by an anti-etching layer, after which the etching process is resumed.

A metal is etched in a plurality of stages to secure a high aspect ratio in any of the conventional techniques described below.

(1) The layer to be etched is coated with a dry film resist (DFR) as a mask, which is patterned by exposure and development, after which the layer to be etched is etched (by "half etching"). The term of "half etching" or "selective etching" in this specification means an etching by which the layer to be etched is not fully etched through the thickness thereof, but etched until a predetermined thickness thereof. The resulting side etched portion is protected by an anti-etching layer, and the etching process executed again thereby to produce a high-density pattern (Japanese Unexamined Patent Publication Nos. 1-188700 and 1-290289, for example). In this case, the use of a positive photosensitive resist (Japanese Unexamined Patent Publication No. 10-229153, for example) or an electrodeposit resist (Japanese Unexamined Patent Publication No. 2004-204251, for example) has been proposed as an anti-etching protective layer for the side etched portion.

These conventional techniques pose a problem, however, in that the light masking property of the DFR forming the anti-etching protective layer of the side etched portion is insufficient and therefore the positive resist under the DFR is melted and generates a gap with the DFR, resulting in the loss of the function as an anti-etching protective layer. Another problem is that the DFR is melted (expanded) and separated by the developer or the adhesion of the DFR is reduced and the DFR is separated by deformation under the liquid pressure of the developer during the development of the positive resist, resulting in the loss of the mask function.

(2) As described above, a method has been proposed in which the DFR is patterned by lamination as a mask on the etched layer, after which the light masking property of the DFR is improved by forming a toner layer as a masking layer on the DFR and the etching process is conducted in a plurality of stages (Japanese Unexamined Patent Publication No. 2005-026646, for example). Also in this case, the DFR is melted (expanded) and separated by the developer during the development of the positive resist or the deformation of the DFR under the liquid pressure of the developer reduces the adhesion of the DFR, which is thus separated.

(3) As in (2) above, a method has been proposed (in Japanese Unexamined Patent Publication No. 2005-026645, for example) in which the etching process is executed in a plurality of stages after forming a thin metal (silver) layer between the etched layer and the DFR to improve the light masking property of the DFR. This method also poses a problem that the DFR is melted (expanded) and separated by the developer during the development of the positive resist, and the liquid pressure of the developer deforms and damages the thin metal layer resulting in a loss of the mask function.

SUMMARY OF THE INVENTION

Accordingly, it is an object of this invention to obviate the conventional problems of the separation of the dry film resist (DFR) in the multi-stage etching process described in (1) and (2).

Another object of this invention is to provide a method of forming a metal plate pattern having a high aspect ratio and a circuit pattern on an insulating base member by multi-stage etching wherein the problems of unstable etching accuracy due to the change in the thickness of mask in the method described in (3) above is solved.

In order to achieve the object described above, according to one aspect of the present invention, there is provided a method of forming a metal plate pattern, comprising the steps of forming a first metal layer patterned of a metal, material of which being different from that of the metal plate, on at least one of two surfaces of the metal plate, selectively half etching the metal plate using the first metal layer as a first mask, coating a negative resist on the half etched surface from an upper portion of the first mask, and by exposure and development from the upper portion of the first mask, removing the unexposed and soluble negative resist of the side etching layer formed under the first mask, forming a second metal layer formed of a metal, material of which being different from that of the metal plate on the side etched layer from which the unhardened negative resist has been removed, with the second metal layer as a second mask, half etching the metal plate again through the first and second masks, and removing the first and second masks.

According to another aspect of the invention, there is provided a method of forming a circuit board, comprising the steps of forming a patterned first metal layer including a metal foil formed on at least one of two surfaces of an insulating base member and material of which being different from that of the metal foil, selectively half etching the metal plate with the first metal layer as a first mask, coating a negative resist on the half etched surface from the upper portion of the first mask, and by exposure and development from the upper portion of the first mask, removing the unexposed and soluble negative resist of the side etching layer formed under the first mask, forming a second metal layer, material which being different from that of the metal plate on the side etching layer from which the unhardened negative resist has been removed, with the second metal layer as a second mask, half etching the metal plate again through the first and second masks, and removing the first and second masks.

In this case, the step of forming the patterned first metal layer includes a step of coating a resist on the metal foil formed on at least one of two surfaces of the insulating base member and forming a resist pattern by patterning the resist, a step of forming the first metal layer by pattern plating at a position not patterned with the resist, and a step of removing the resist.

Also, the step of coating, exposing and developing the negative resist and removing the soluble negative resist of the side etched layer under the first mask, forming the second metal layer on the side etched layer as a second mask, a step of half etching the metal foil again through the first and second mask are repeatedly conducted.

In the second and subsequent sessions of the process repeated as described above, a positive resist may be coated in place of the negative resist, a hardened layer of the positive resist may be formed on the side etching layer under the first mask, and the hardened negative resist may be used as a second mask.

Also, the metal plate or the metal foil is formed of copper, iron or iron-nickel alloy soluble by the etching solution used, and the metal plating layer is a tin plating layer, a solder plating layer, a silver plating layer or a gold plating layer not solved by the etching solution.

Further, the resist coated on the metal plate or the metal foil is a dry film resist, and the negative resist is a liquid negative resist or an electrodeposited resist.

According to still another aspect of the invention, there is provided a method of forming a metal plate pattern, comprising the steps of dipping the metal plate pattern fabricated by the aforementioned forming method and a metal, material of which being the same as or different from that of the metal plate, in an electrolytic solution, and applying a voltage between the metal plate pattern in the electrolytic solution as a positive electrode and the same or different metal a negative electrode and electrolytically polishing by preferentially eluting the protrusions on the surface of the metal plate pattern.

According to a further aspect of the invention, there is provided a method of forming a circuit board, comprising the steps of dipping the circuit board fabricated by the aforementioned forming method and a metal, material of which being the same as or different from the pattern metal of the circuit board, in an electrolytic solution, and applying a voltage between the circuit board in the electrolytic solution as a positive electrode and the same or different metal as a negative electrode and electrolytically polishing by preferentially eluting the protrusions on the surface of the circuit board.

DESCRIPTION OF THE PREFERRED EMBODIMENTS

Embodiments of the invention are described in detail below with reference to the accompanying drawings.

Figure 1:
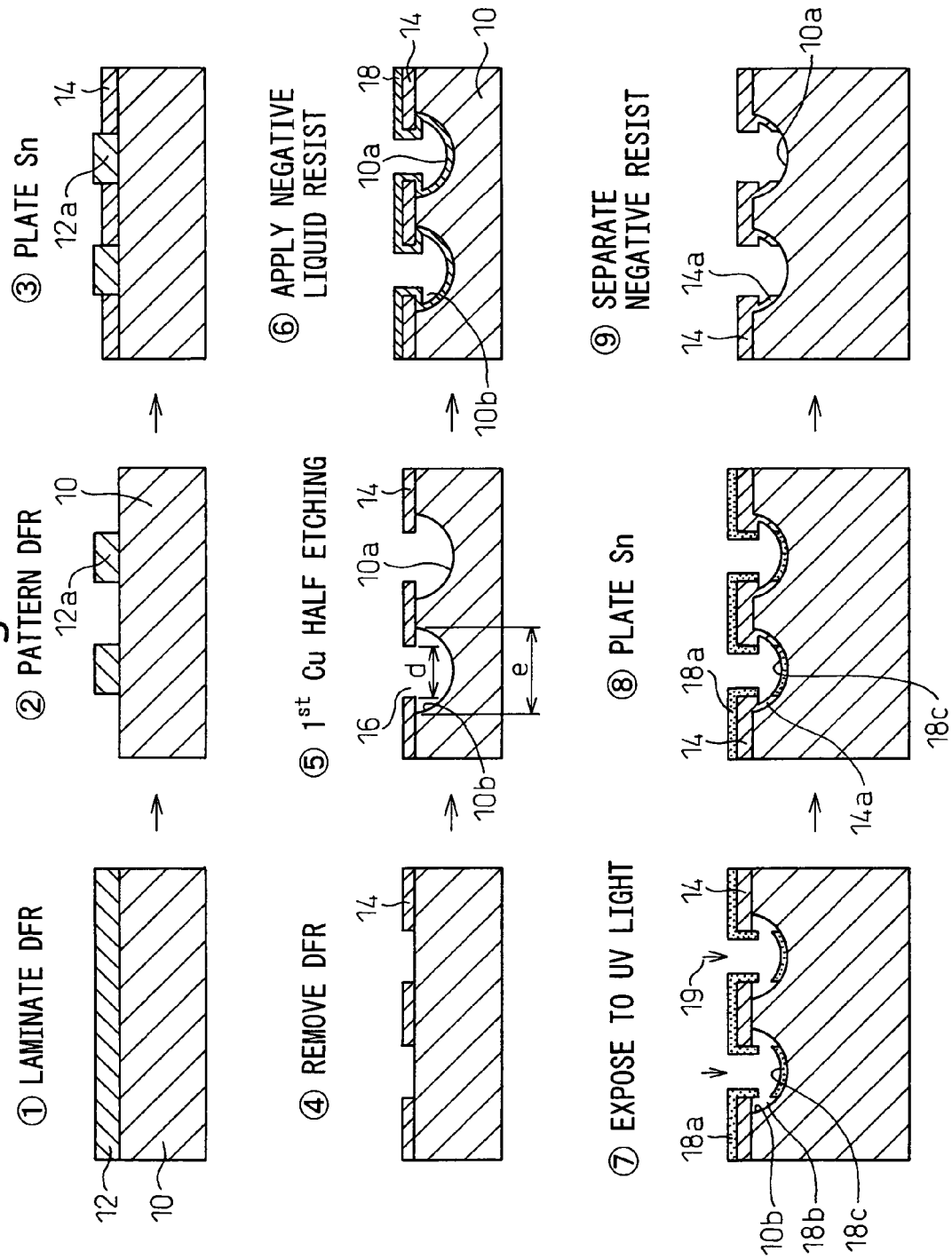
FIG. 1 shows the steps of a method of forming a metal plate pattern by multi-stage etching from one surface of a metal plate according to a first embodiment of the invention.
Figure 2:
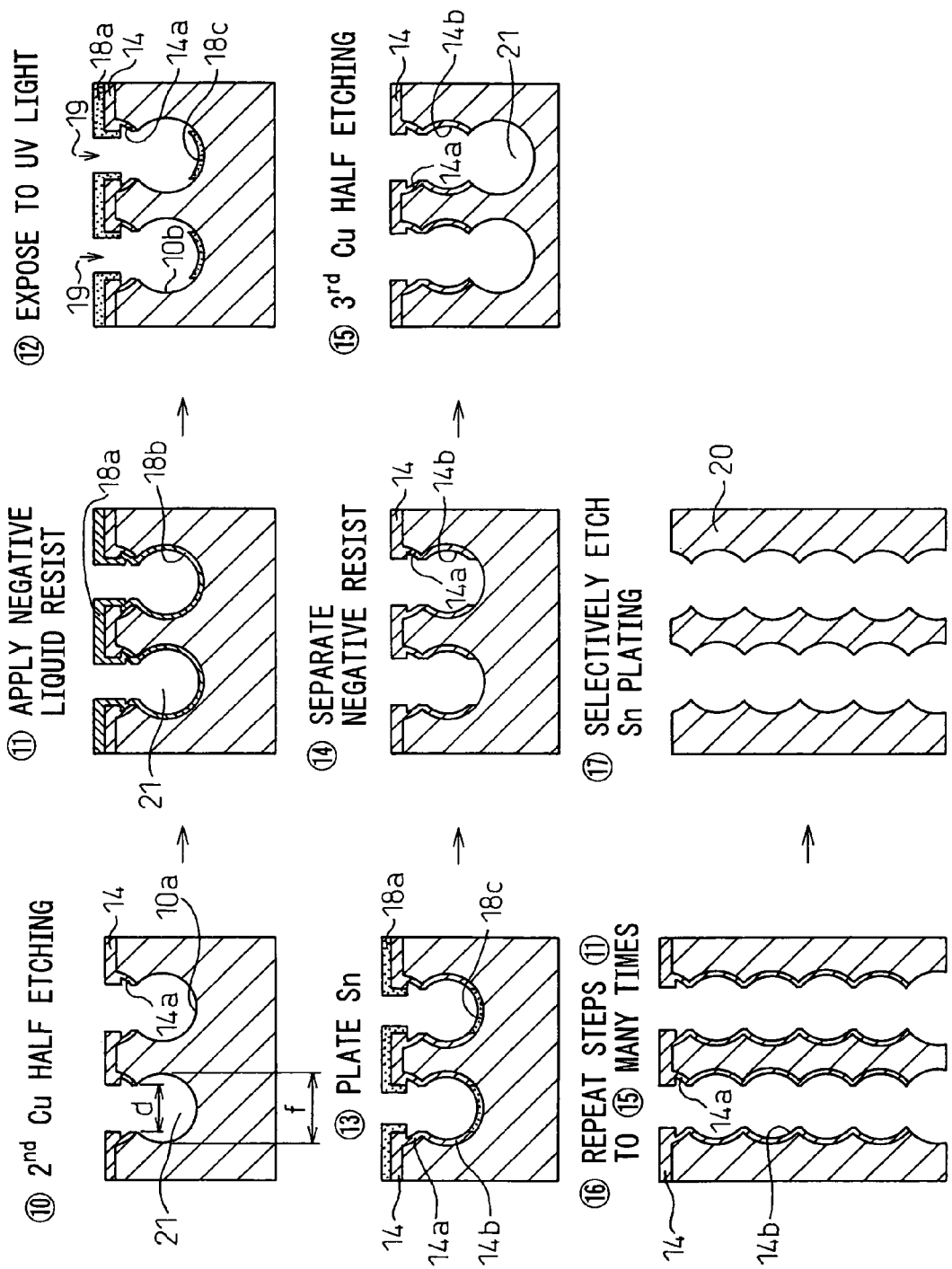
FIG. 2 shows the steps of a method of forming a metal plate pattern following the process shown in FIG. 1.

FIGS. 1 and 2 show the steps of a method of forming a metal plate pattern such as a lead frame using the semiadditive process according to a first embodiment of the invention. According to the first embodiment, the metal plate pattern is formed by conducting the multi-stage etching from one surface of a metal plate.

In a first step, one surface of a metal plate 10, made of copper as a metal base member, is coated in its entirety with a laminate dry film resist (DFR) 12, which is patterned by being exposed and developed with a predetermined mask pattern (not shown) in a second step.

In a third step, with the patterned DFR 12a as a mask, a tin plating layer 14 is formed in each opening of the DFR 12a by electrolytic plating using the metal plate 10 as a negative electrode. In a fourth step, the DFR 12a is separated, by a well-known method, to leave the tin plating pattern 14 on the metal plate 10.

In a fifth step, the half etching or selective etching is conducted by spraying an etching solution on the metal plate 10 with the tin plating pattern 14 as a mask. In this half etching process, each area around the portion under the metal plate 10 where the etching solution passes is removed by the etching solution with the tin plating pattern as a first mask. Each removed area of the metal plate 10 fails to reach the lower surface of the metal plate 10. On the other hand, the side portion 10b under the mask is also etched by what is called by "side etching". In the first half etching session, therefore, the conditions (etching time, etc.) for the half etching process are adjusted to remove the area of the metal plate 10 within a predetermined range.

As a result, as shown, in each upper portion of the metal plate 10 in proximity to the first mask pattern 14, the removed portion of the metal plate 10 somewhat intrudes inward of the metal plate 10 from the width (d) of each portion of the first mask pattern 14 where the etching solution passes. Thus, a side etched portion 10b is formed in which the width (c) of the removed portion is larger than the width (d) of the first mask pattern. On the other hand, each groove portion removed by etching of the metal plate 10 fails to reach the lower surface of the metal plate 10 and constitutes a substantially U-shaped groove 10a having a somewhat rounded cross section.

Next, in a sixth step, the whole surface including the portion half etched in the preceding step is coated with a negative liquid resist 18. In this case, the negative liquid resist 18 is applied on the upper and side surfaces of the tin plating pattern layer 14, the bottom portion of each substantially U-shaped groove 10a of the metal plate 10 removed by etching and each side etched portion 10b.

In a seventh step, parallel ultraviolet light rays 19 are radiated from the upper surface of the negative liquid resist 18 for exposure and development. The ultraviolet light 19 used for exposure is desirably parallel light radiated in the direction perpendicular to the surface of the mask on the metal plate 10. The ultraviolet light 19, however, is not necessarily parallel light if capable of reaching deep into the negative liquid resist 18.

In this exposure step, each portion 18a of the negative liquid resist 18 on the tin plating pattern layer 14, the portion thereof on each side surface of the tin plating pattern layer 14 and each portion 18c on the bottom of the substantially U-shaped groove 10a are exposed. In other words, the area 18b on the side etched portion 10b under the tin plating pattern layer 14 which is removed somewhat inward of the metal plate 10 from the mask pattern width (d) in the preceding half etching step remains unexposed.

As a method of forming the negative resist 18, a negative resist may be formed by electrodeposition only to the portion having a metal surface, instead of coating the liquid resist 18.

In the development step, the liquid resists 18a, 18c of the exposed portion are hardened and left as they are, while only the resist 18b of the unexposed elutable portion on the side etched portion 10b is removed.

Next, in an eighth step, with the remaining resists 18a, 18c as a masking, a tin plating layer 14a is formed in each opening of these resists on each side etched portion 10b of the metal plate 10 from which the resist 18b is removed. In this case, the tin plating layer 14a can be formed by electrolytic plating with the metal plate 10 itself as a negative electrode. Then, in a ninth step, the remaining resists 18a, 18c are separated by a well-known method thereby to leave tin plating patterns 14, 14a on the metal plate 10.

Next, tenth and subsequent steps according to the first embodiment are explained with reference to FIG. 2. In the tenth step, the second half etching or selective etching is carried out by applying the etching solution to the metal plate 10 through a second mask constituted of the upper tin plating layer 14 and the tin plating layer 14a formed on the surface of the side etched portion. In this second half etching step, the portion 10a of the metal plate not protected by the tin plating layers 14, 14a is etched and a groove 21 having a substantially circular cross section is formed. The width (f) of this groove 21 is larger than the mask pattern width (d) of the tin plating pattern layers 14, 14a.

Next, in an 11th step, the negative liquid resist 18 is coated again over the whole surface including the portion subjected to the second half etching in the preceding step. In a 12th step, the parallel ultraviolet light 19 is radiated from the upper surface of the negative liquid resist 18 for exposure, followed by development. Like in the seventh step described above, the ultraviolet light 19 used for exposure is desirably the parallel light radiated in the direction perpendicular to the surface of the mask on the metal plate 10. In the case where the light rays reach deep into the negative liquid resist 18, however, the ultraviolet light is not necessarily parallel light.

In this exposure step, the portion 18a of the negative liquid resist 18 on the tin plating layer 14, the side surface portion of the tin plating pattern layer 14 and the portion 18c on the bottom of the substantially U-shaped groove 21 are exposed. In other words, as in the first half etching session, the area 18b on the side etched portion 10b under the tin plating pattern layer 14 which is melted by somewhat intruding inward of the metal plate 10 from the mask pattern width (d) remains unexposed, and is removed as an elutable portion in the development step.

In a 13th step, like in the eighth step described above, with the remaining resists 18a, 18c as a masking, a tin plating layer 14b is formed in each opening of these resists on the side etched portion 10b of the metal plate 10 from which the resist 18b is removed. In this case, like in the aforementioned case, the tin plating layer 14b can be formed by electrolytic plating with the metal plate 10 itself as a negative electrode. Then, in a 14th step, the remaining resists 18a, 18c are separated by a well-known method thereby to leave the tin plating patterns 14, 14a, 14b on the metal plate 10. In a 15th step, a third half etching is carried out.

Subsequently, the process of the 11th to 15th steps is repeated as many times as required to obtain a desired groove with reference to thickness, material or the other factors of the metal plate (16th step). In the last 17th step, the remaining tin plating patterns 14, 14a, 14b are removed. Finally, therefore, a lead or a metal plate pattern 20 having a higher aspect ratio than that formed by prior art metal pattern forming methods, i.e. small in the difference of width between the upper and lower surfaces in the cross section of the lead 20 of the lead frame constituting a conductor pattern is produced. In this way, the width of lead of the lead frame can be minimized.

Figure 3:
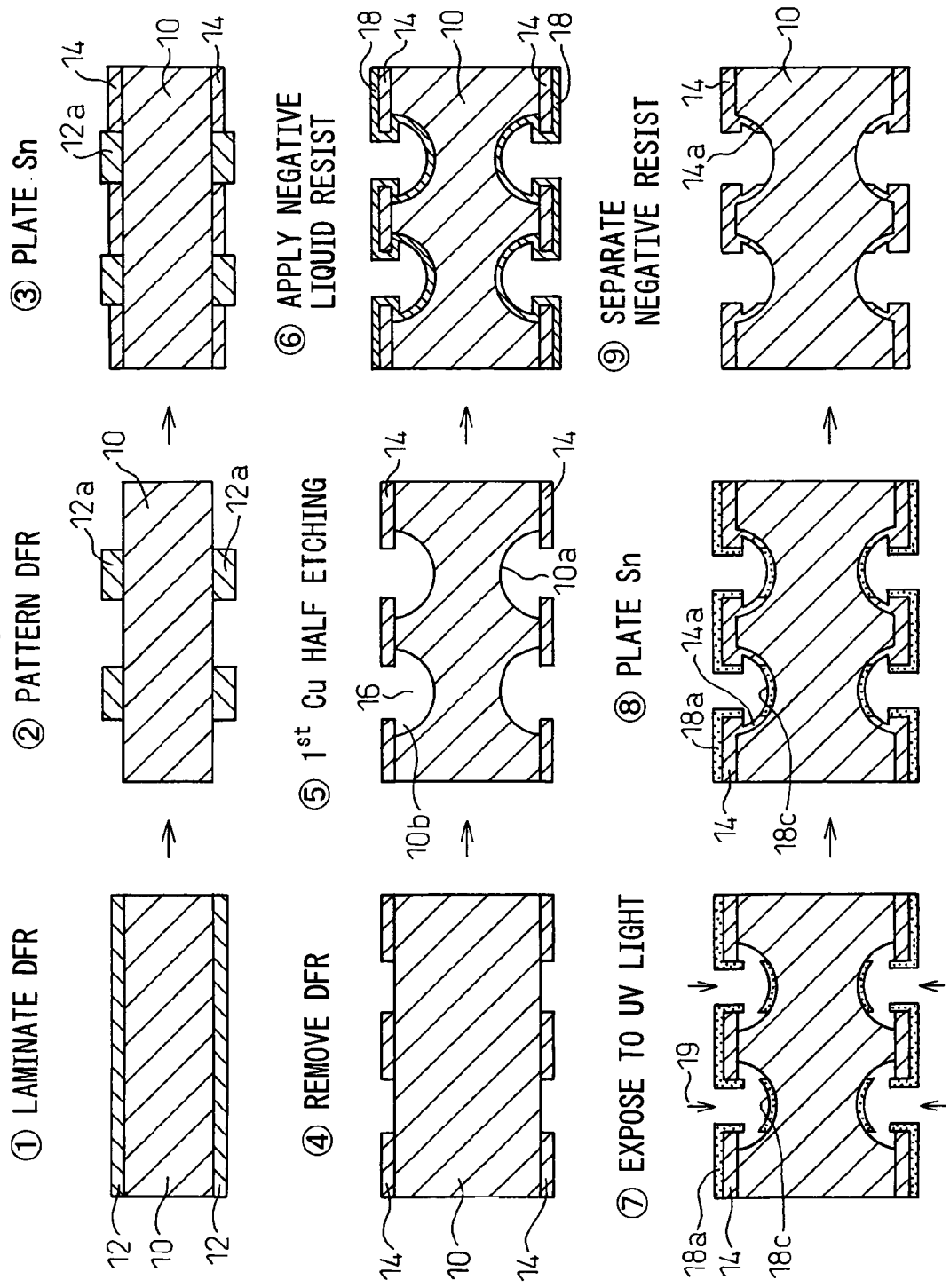
FIG. 3 shows the steps of a method of forming a metal plate pattern by multi-stage etching from the two surfaces of a metal plate according to a second embodiment of the invention.
Figure 4:
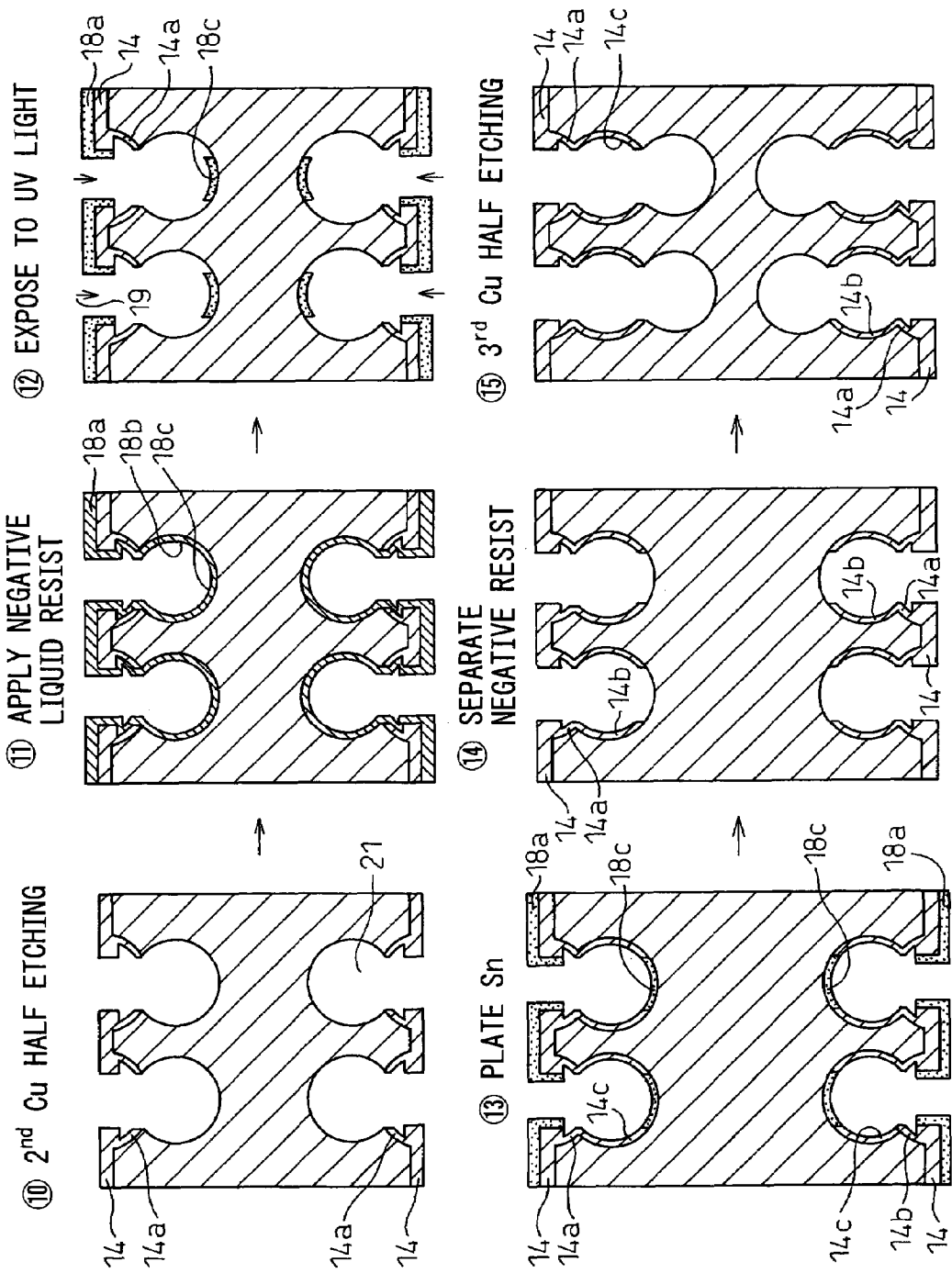
FIG. 4 shows the steps of a method of forming a metal plate pattern following the process shown in FIG. 3.
Figure 5:
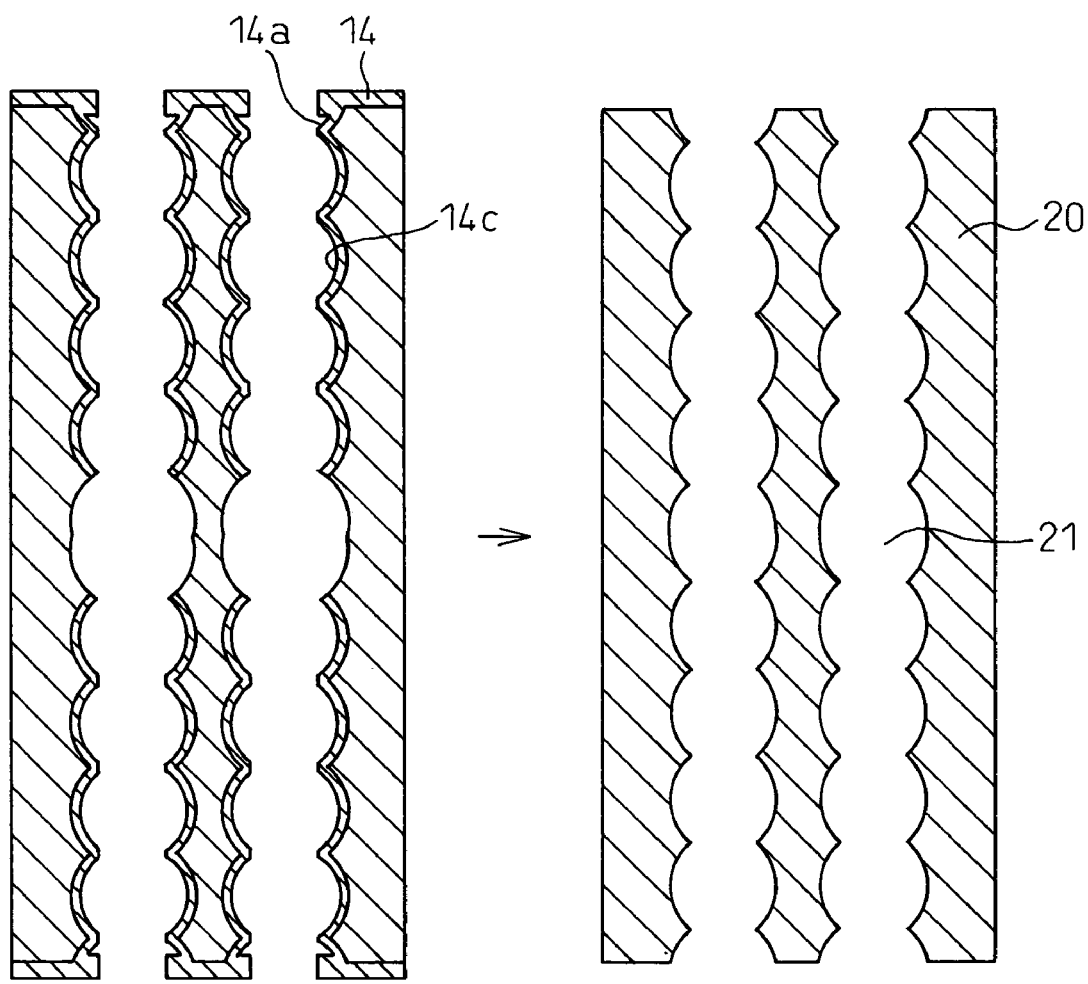
FIG. 5 shows the steps of a method of forming a metal plate pattern following the process shown in FIG. 4

FIGS. 3 to 5 show the steps of a method of forming a metal plate pattern such as a lead frame or a metal mesh according to a second embodiment of the present invention using the semiadditive method. According to the second embodiment, the metal plate pattern is formed by multi-stage etching from the two surfaces of a metal plate.

Except that the two surfaces of the metal plate are processed at the same time, the second embodiment is basically similar to the first embodiment in which the processing is started from only one surface of the metal plate. Specifically, in a first step, a dry film resist (DFR) 12 is coated over the whole of the upper and lower surfaces of the metal plate 10 of copper as a base metal member. In a second step, the resist is patterned by exposure and development with a predetermined mask pattern.

In the third step, a tin plating layer 14 is formed in each opening of the DFR 16 using the patterned DFR 12a as a mask in a similar manner on the upper and lower surfaces of the metal plate 10. In a fourth step, the DFR 12a is separated by a well-known method while at the same time leaving the tin plating layer 14 on the metal plate 10. In a fifth step, an etching solution is applied on the two surfaces of the metal plate 10 at the same time with the tin plating pattern 14 as a first mask, so that each surface is half etched or selectively etched. As a result, a substantially U-shaped groove 10a having a generally rounded cross section is formed at each portion and removed by etching on the two surfaces of the metal plate 10.

Next, in a sixth step, the negative liquid resist 18 is applied on the whole of the two surfaces of the metal plate 10 including the portions half etched in the preceding step. In a seventh step, the parallel ultraviolet light 19 for exposure and development is radiated from the upper surface of the negative liquid resist 18 on the two surfaces of the metal plate 10. In this development step, the unexposed liquid resist 18b on the side etched portion 10b is removed as an elutable portion while the resists 18a, 18c exposed and set are left as they are.

In an eighth step, with the remaining resists 18a and 18c as a mask, a tin plating layer 14a is formed in the opening of each of these resists. In a ninth step, the remaining resists 18a, 18c are separated in such a manner as to leave the tin plating patterns 14, 14a on the metal plate 10.

In a tenth step shown in FIG. 4, the second half etching or selective etching is performed by applying the etching solution with the tin plating pattern layers 14, 14a as a second mask.

In an 11th step, the negative liquid resist 18 is applied again on the whole of the two surfaces of the metal plate 10. In a 12th step, the parallel ultraviolet light 19 is radiated for exposure and development on the negative liquid resist 18 from the two surfaces of the metal plate.

In a 13th step, with the remaining resists 18*a* and 18*c* as a masking, a tin plating layer 14*b* is formed again in the opening of each of these resists. In a 14th step, the remaining resists 18*a*, 18*c* are separated to leave the tin plating patterns 14, 14*a* on the metal plate 10. In a 15th step, a third half etching session is conducted.

Subsequently, the 11th to 15th steps described above are repeated for the required number of times (16th step). In the last 17th step, the remaining tin plating patterns 14, 14*a*, 14*b* are removed, thereby finally producing a lead or a metal pattern 20 high in aspect ratio.

Also, according to the second embodiment, the multi-stage etching is carried out from the two surfaces of the metal plate 10, and therefore a metal pattern still higher in aspect ratio can be formed. Further, the multi-stage etching carried out from the two surfaces of the metal plate can form a metal pattern within a shorter length of time.

Figure 6:
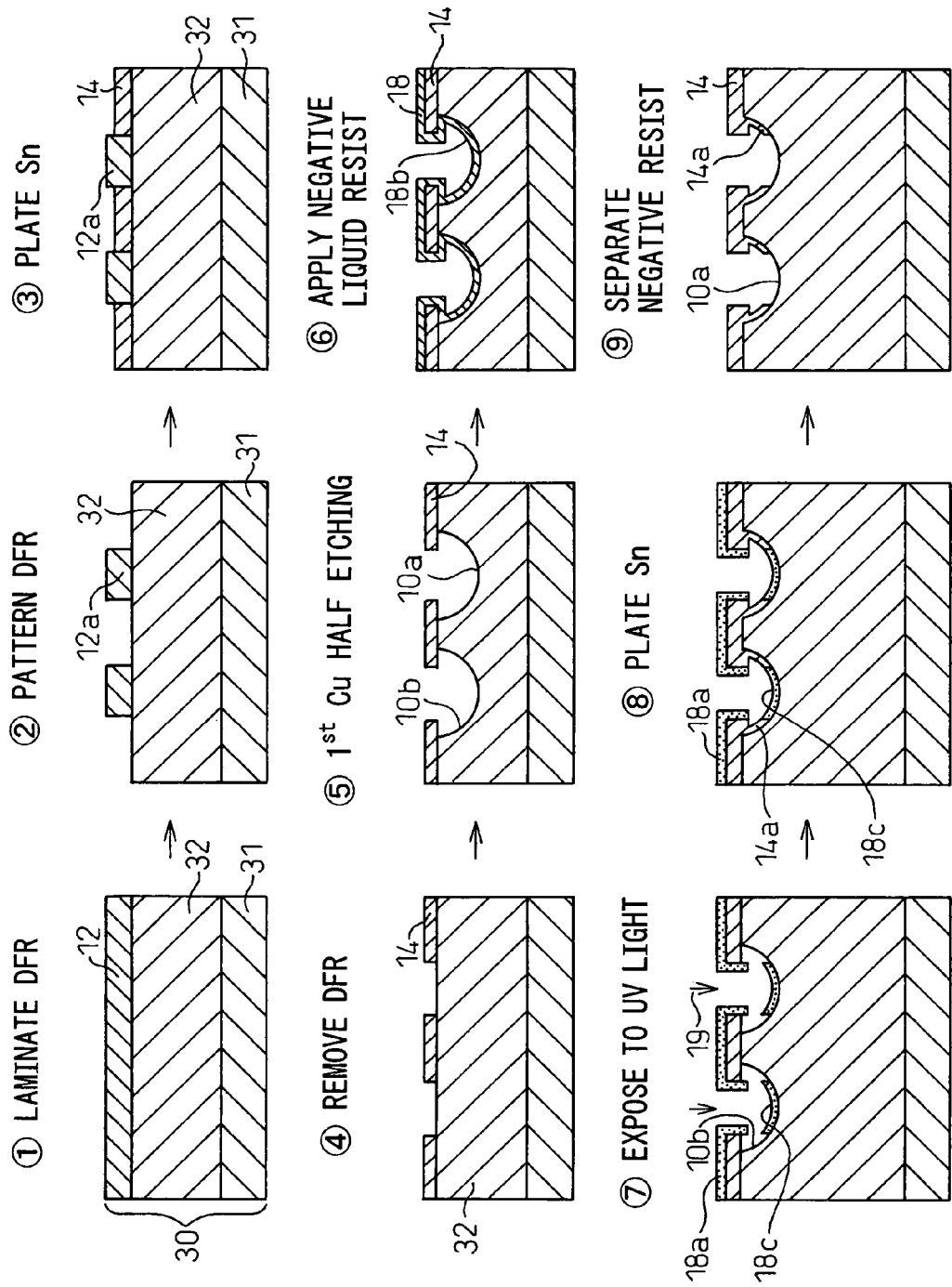
FIG. 6 shows the steps of a method of forming a circuit board by multi-stage etching from one surface of a resin substrate according to a third embodiment of the invention.
Figure 7:
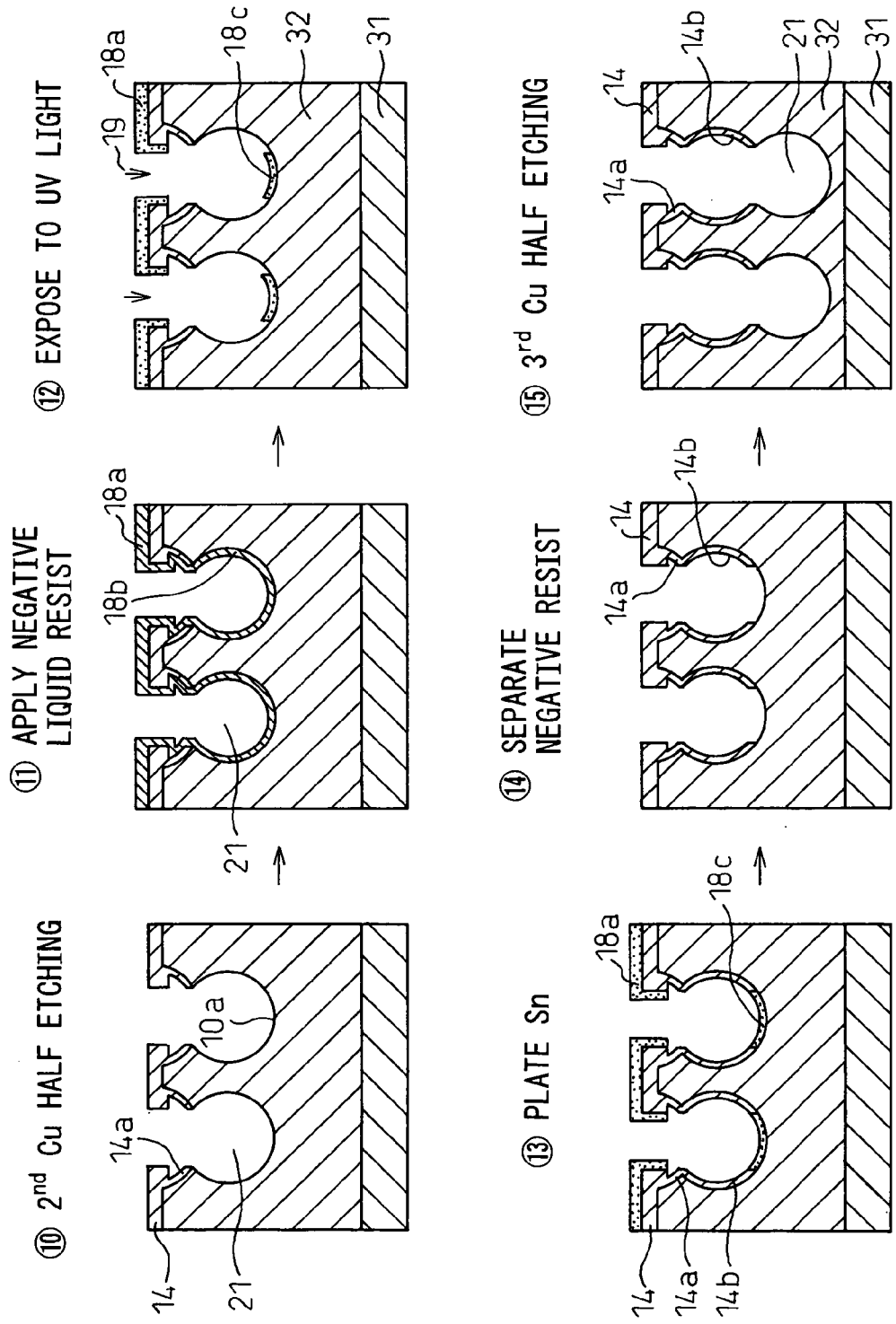
FIG. 7 shows the steps of a method of forming a circuit board following the process shown in FIG. 6.
Figure 8:
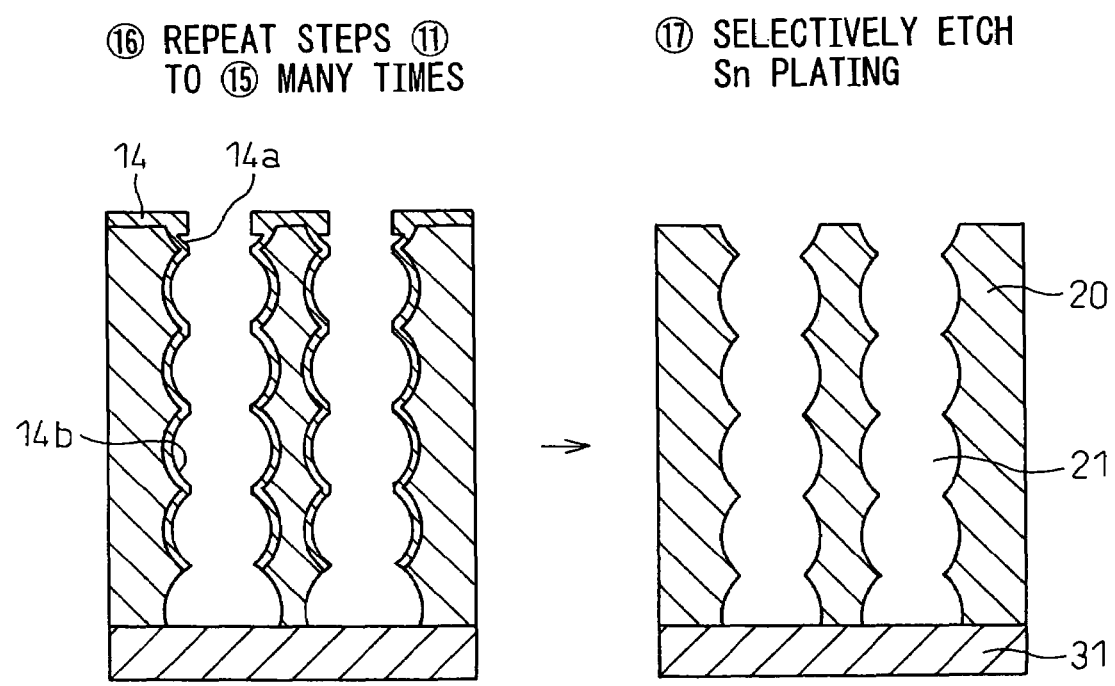
FIG. 8 shows the steps of a method of forming a circuit board following the process shown in FIG. 7.

FIGS. 6 to 8 show the steps of a method of forming a wiring pattern on a circuit board according to a third embodiment of the present invention. In the third embodiment, the circuit board is formed by multi-stage etching, from one surface of a two-side copper-clad resin plate, in which the wiring pattern is formed similarly to the metal plate pattern in the first embodiment.

In a first step, the whole of one surface of the two-side copper-clad resin plate 30 carrying a copper foil 32 on both surfaces of an insulating base member 31 is coated with a dry film resist (DFR) 12. In a second step, the resist is patterned by exposure and development with a predetermined mask pattern (not shown).

In a third step, with the patterned DFR 12*a* as a mask, a tin plating layer 14 is formed in each opening of the DFR 12*a* by electrolytic plating with the copper foil 32 as one electrode (negative electrode). In a fourth step, the DFR 12*a* is separated by a well-known method while leaving the tin plating pattern 14 on the copper foil 32.

In a fifth step, the etching solution is applied to the copper foil 32 with the tin plating pattern 14 as a first mask thereby to conduct half etching or selective etching. In the half etching process, the area around the copper foil 32 under the portion of the tin plating pattern 14 constituting the first mask where the etching solution passes is removed. The removed area of the copper foil 32 fails to reach the lower surface of the copper foil 32, while the side portion of the lower part of the mask is also etched in what is called the side etching. Thus, the conditions for half etching (etching time, etc.) are adjusted so that the removed area of the copper foil 32 covers not more than a predetermined range.

As a result, as shown, the side etched portion 10*b* is formed at the upper portion of the copper foil 32 in proximity to the first mask pattern 14, while each removed groove portion constitutes a substantially U-shaped groove 10*a* having a generally rounded cross section.

In a sixth step, the negative liquid resist 18 is coated over the entire surface including the portion half etched in the preceding step. In this case, the negative liquid resist 18 is coated over the upper and side surfaces of the tin plating pattern layer 14, the bottom portion of the substantially U-shaped groove 10*a* of the copper foil 32 removed by etching and the side etched portion 10*b*.

Next, in a seventh step, the parallel ultraviolet light 19 is radiated from the upper surface of the negative liquid resist 18 for exposure, followed by development in which the resists 18*a* and 18*c* of the exposed portion are left by being set. while the resist 18*b* on the unexposed side etched portion 10*b* is removed. In an eighth step, with the remaining resists 18*a*, 18*c* as a masking, a tin plating layer 14*a* is formed in each opening of these resists. In a ninth step, the remaining resists 18*a*, 18*c* are separated.

In a tenth step, the etching solution is applied to carry out the second half etching or selective etching using the remaining tin plating pattern layers 14 and 14*a*, as a second mask. In an 11th step, the negative liquid resist 18 is applied again over the whole surface including the portion subjected to the second half etching session in the preceding step. In a 12th step, the parallel ultraviolet light 19 is radiated from the two surfaces of the negative liquid resist 18 for exposure and development.

Next, in a 13th step, with the remaining resists 18*a* and 18*b*as a masking, a tin plating layer 14*b* is formed again in each opening of these resists. In a 14th step, the remaining resists 18*a*, 18*c* are separated in such a manner as to leave the tin plating patterns 14, 14*a* on the metal plate 10. In a 15th step, a third half etching process is conducted.

After that, the process of the 11th to 15th steps is repeated as many times as required to obtain a desired groove with reference to thickness, material or the other factors of the metal plate (16th step). In the last 17th step, the remaining thin plating patterns 14, 14*a* and 14*b* are removed thereby to finally produce a circuit board having a wiring pattern 20 high in aspect ratio on the substrate.

Figure 9:
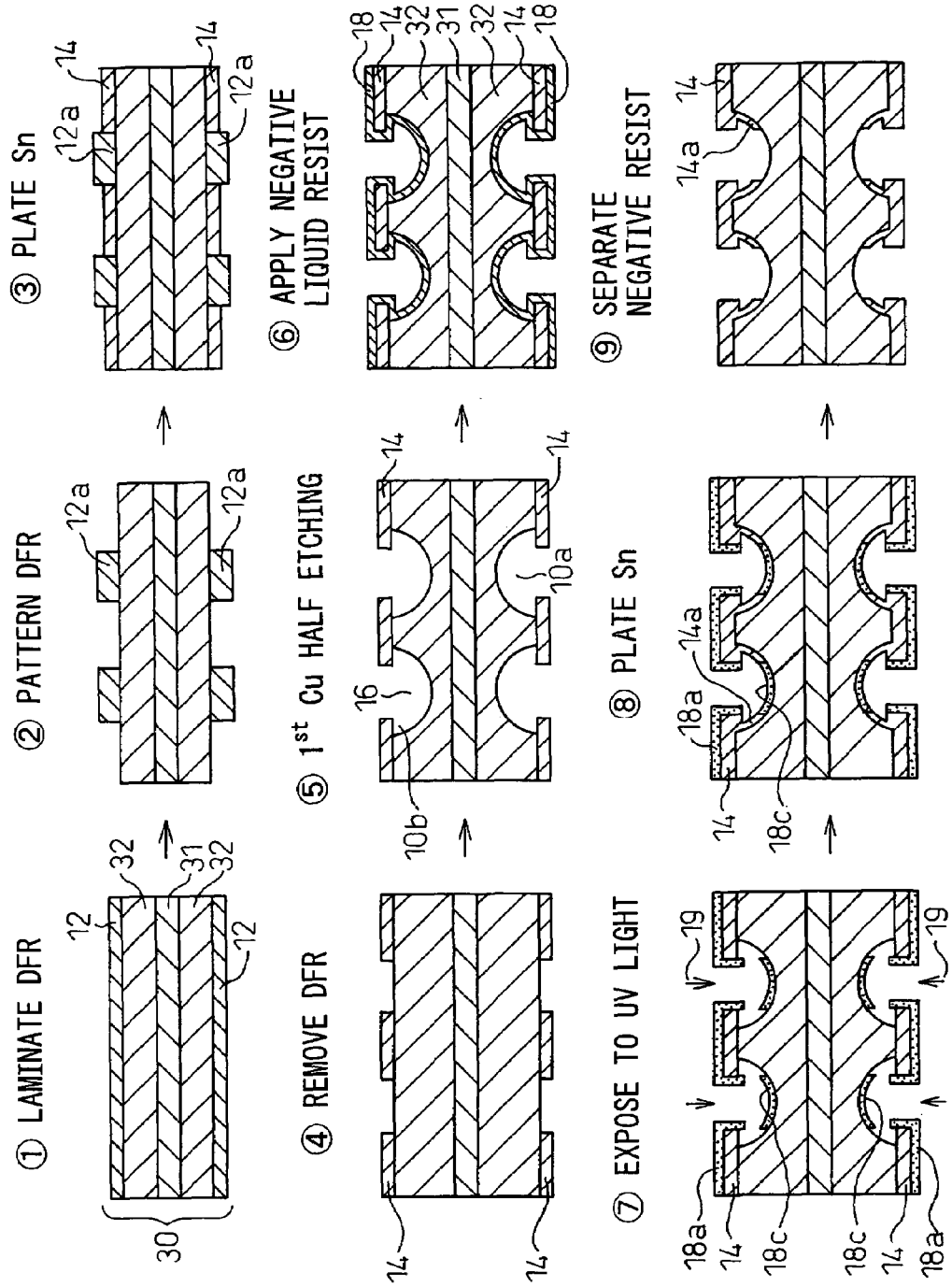
FIG. 9 shows the steps of a method of forming a circuit board by multi-stage etching from the two surfaces of a resin substrate according to a fourth embodiment of the invention.
Figure 10:
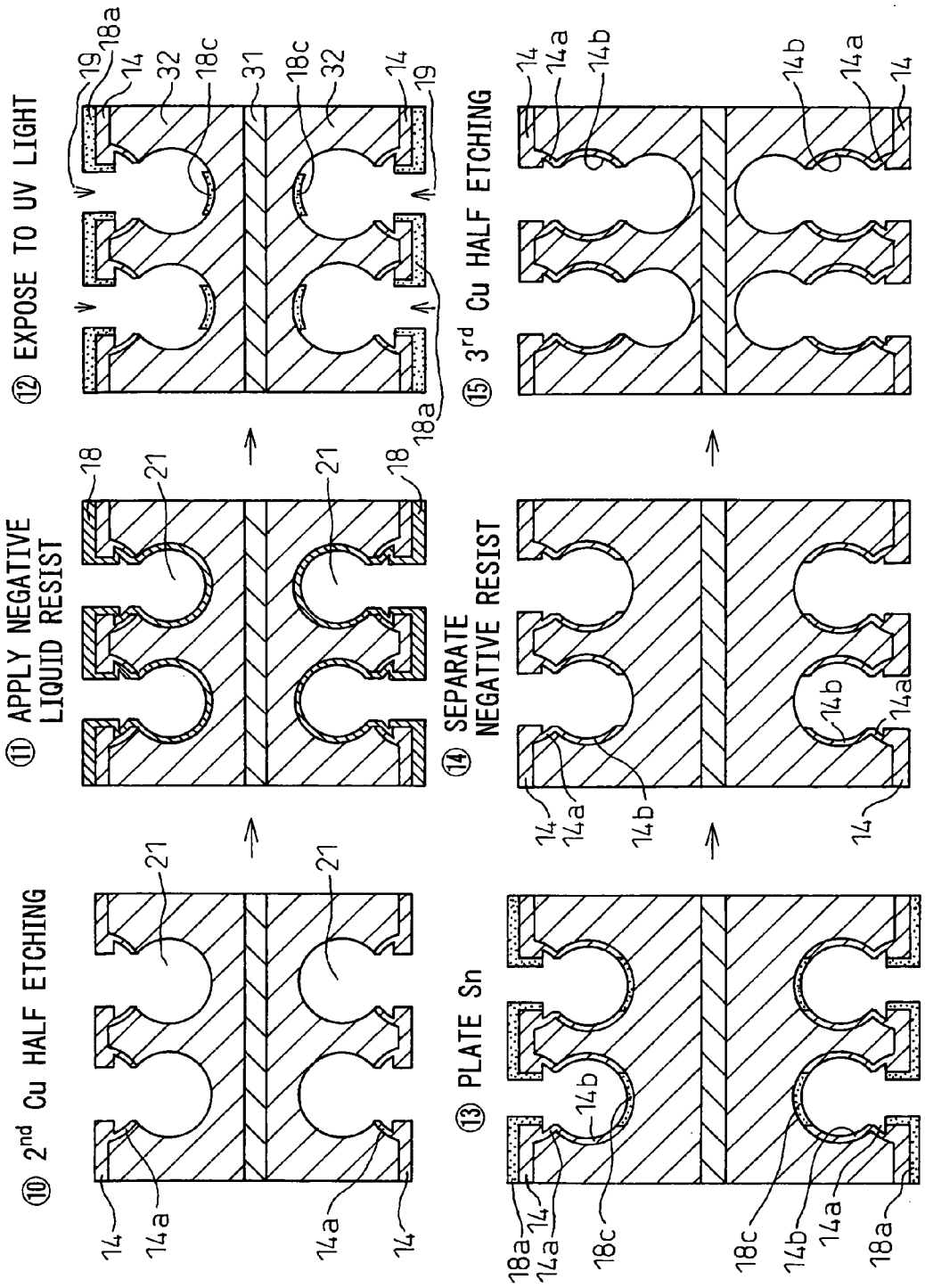
FIG. 10 shows the steps of a method of forming a circuit board following the process shown in FIG. 9.
Figure 11:
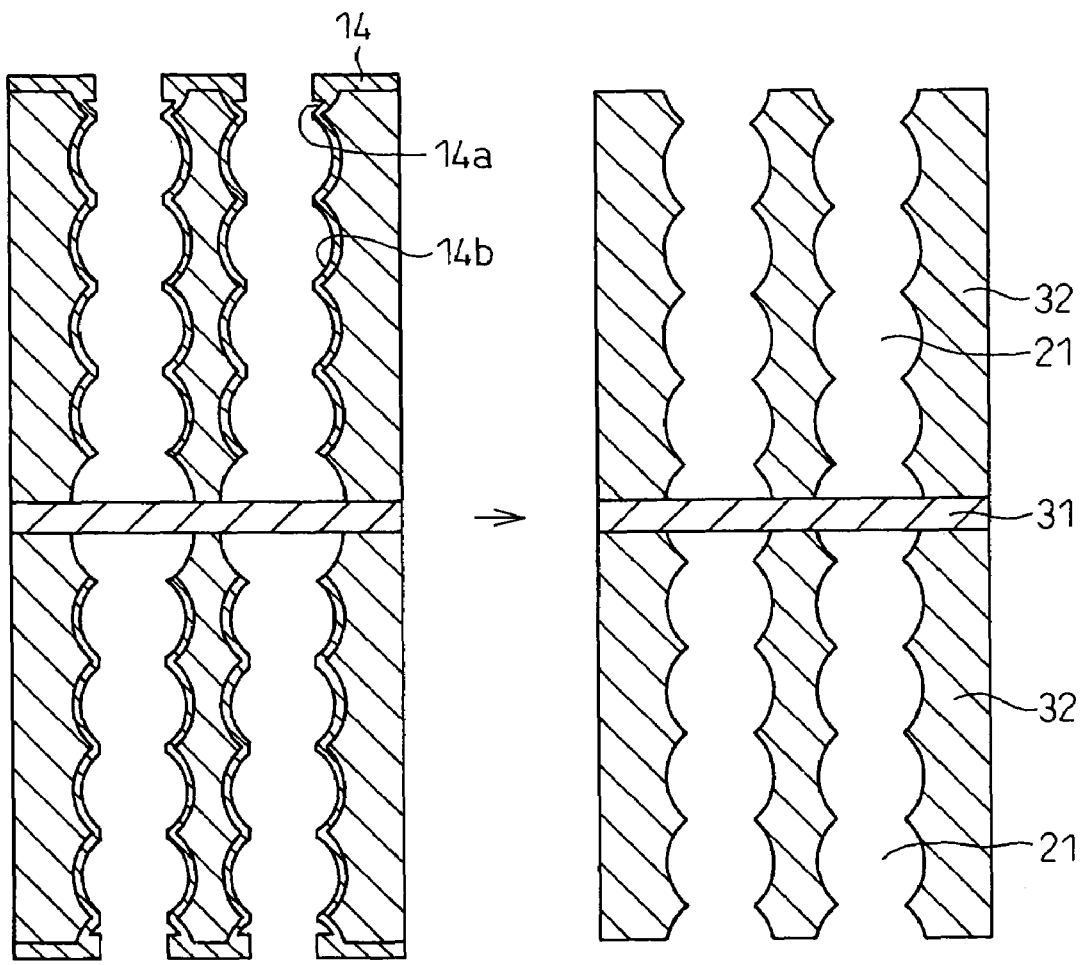
FIG. 11 shows the steps of a method of forming a circuit board following the process shown in FIG. 10.

FIGS. 9 to 11 show a method, step by step, of forming a conductor pattern on a circuit board according to a fourth embodiment of the present invention. According to the fourth embodiment, the circuit board is formed by multi-stage etching from the two surfaces of a two-side a copper-clad resin plate. This embodiment is similar to the third embodiment for forming a circuit board and also similar to the second embodiment in starting the processing from the two surfaces at the same time. Therefore, this embodiment is not described in detail.

According to the fourth embodiment, a circuit board having a high aspect ratio wiring pattern can be finally formed. The fourth embodiment is explained above with reference to a case having the same wiring pattern on the upper and lower surfaces of the resin substrate 31. Nevertheless, different wiring patterns may be formed concurrently on the upper and lower surfaces of the resin substrate 31 depending on the type of the circuit board.

In forming a lead frame or a wiring pattern on the insulating substrate according to each of the first to fourth embodiments described above, the type of the etching solution, the etching time and other parameters must, of course, be adjusted appropriately in accordance with various conditions including the material, thickness, pitches and the inter-pattern distance of the metal patterns.

Also, in spite of the foregoing description of a case in which the metal plate is formed of copper (first and second embodiments) or copper attached to the resin substrate (third and fourth embodiments) as a base member to be etched, the metal base member can alternatively be formed of iron, iron-nickel alloy, etc. as well as copper with equal effect.

The foregoing explanation refers to a case in which the masking layer used for selectively etching the metal substrate is formed of the tin plating as a metal not soluble in the etching solution for melting the copper of the base member. Nevertheless, a metal other than tin such as solder plating or silver plating can be used which is not soluble as a masking in the process of partially removing the metal (copper, iron or iron-nickel alloy) constituting the base member by etching. These metals can be appropriately selected from the viewpoint of type and cost of the base metal member.

In this connection, according to the first to fourth embodiments described above, both the masking material (reference numeral 14) used for the first session and the masking material (reference numerals 14a, 14b) for the second and subsequent sessions in the side etched portion are tin. As far as the masking material used for the second and subsequent sessions is concerned, however, any other material than tin which is different from the metal base member can be used. Also, the method of forming the masking for the second and subsequent sessions is not limited to the electrolytic platting, but the nonelectrolytic plating, vapor deposition, sputtering, etc. is also applicable with equal effect. Nevertheless, the electrolytic plating is most suitable to secure the film thickness within a predetermined range.

Also, in the first to fourth embodiments described above, the same negative liquid resist 18 is used as the resist material coated over the entire surface both in the sixth step and the second and subsequent sessions (11th and subsequent steps). As an alternative, however, the negative liquid resist 18 is applied for the first coating as in the embodiments described above, while the positive liquid resist 18 may be used for the second and subsequent sessions. By exposing and developing this resist, the resist at the very side etched portion is set and can be used as a mask. In this case, the set resist itself functions as a mask in place of the tin plating (numeral 14b).

Figure 12:
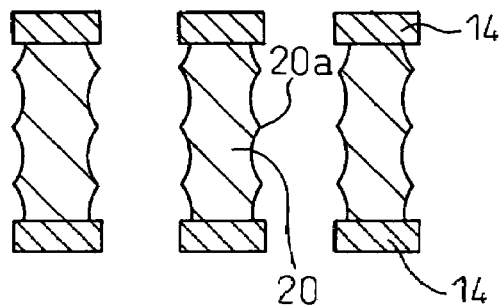
FIG. 12 shows a metal partitioning wall after a plurality of etching sessions and removing the resist.
Figure 13:
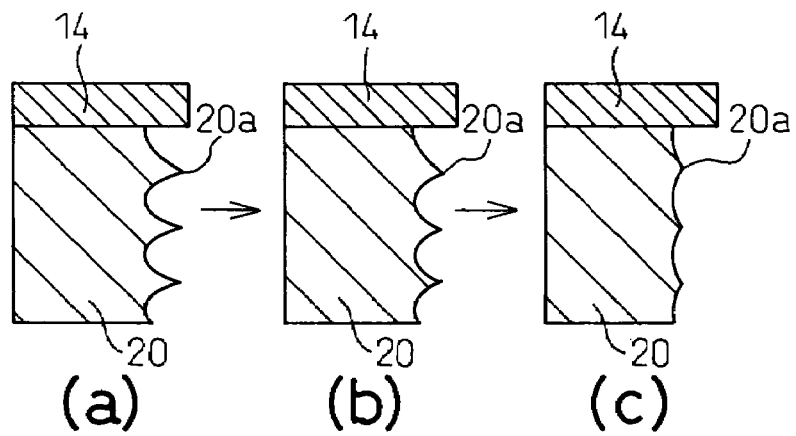
FIG. 13 shows the process of electrolytically polishing the metal partitioning wall.
Figure 14:
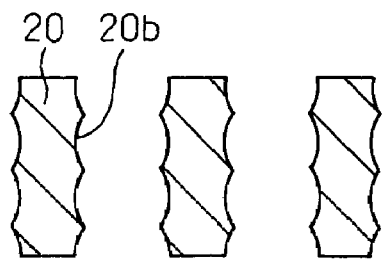
FIG. 14 shows the metal partitioning wall after electrolytic polishing.

FIGS. 12 to 14 show a method of flattening by eliminating the protrusions remaining on the metal plate pattern or the high aspect ratio wiring pattern formed as the result of conducting a plurality of etching sessions according to the first to fourth embodiments. With the partitioning wall of the metal pattern as a positive electrode and a metal of the same type as the metal partitioning wall as an opposite electrode, the two electrodes are dipped in an electrolytic solution. Upon application of a voltage between the two electrodes, the electric field is concentrated on the protrusions of the metal partitioning wall constituting the positive electrode, from which elution occurs preferentially, thereby making it possible to flatten the partitioning wall surface of the metal pattern. The process of this electrolytic polishing is explained below.

FIG. 12 shows a state in which the tin plating pattern protecting the surfaces and the side etching layer are removed by a plurality of etching sessions. Protrusions 20a remain on the partitioning wall surface of the metal pattern 20 after the plurality of etching sessions.

In a partly enlarged view of FIG. 13 showing the partitioning wall surface of the metal pattern 20, the positive electrode constituted of the partitioning wall of the metal pattern 20 and the negative electrode constituted of a metal (such as copper) of the same type as the metal partitioning wall (such as copper) are dipped in the electrolytic solution, and a voltage is applied between the two electrodes to cause the elution of the positive electrode. The electric field is concentrated on the protrusions 20a of the metal partitioning wall, and therefore the protrusions 20a on the surface of the partitioning wall are eluted into the electrolytic solution preferentially. As shown in FIGS. 13(a) to 13(c), therefore, the flatness degree of the metal partitioning wall gradually increases during the electrolytic polishing process. Finally, therefore, as shown in FIG. 13, the metal pattern 20 having a partitioning wall 20b high in flatness degree is formed.

In the electrolytic polishing process shown in FIGS. 12 to 14, the metal used as an electrode opposed to the metal plate pattern or the wiring pattern constituting the positive electrode is of the same type of metal as the metal plate pattern or the wiring pattern, as the case may be. As an alternative, a different type of metal may be used as the negative electrode. Then, the two electrodes may be dipped in an electrolytic solution and a voltage applied between them to conduct the electrolytic polishing process. Also, in such a case, the electric field is concentrated at the protrusions of the partitioning wall of the metal plate pattern or the wiring pattern, and the protrusions are eluted into the electrolytic solution preferentially, so that the metal partitioning wall is flattened.

The embodiments of the invention are explained above with reference to the accompanying drawings. This invention, however, is not limited to those embodiments, and can be variously modified or altered without departing from the scope and spirit thereof.

As described above, according to this invention, the pitch of the metal plate pattern or the wiring pattern of the circuit board can be made narrow. Also, the width of the upper portion of the metal plate pattern or the wiring patter can be secured, so that the difference in pattern width between the upper portion and the lower portion can be reduced thereby to increase the aspect ratio.

In view of the fact that a metal mask having an appropriate thickness is used as a mask layer of the positive resist, the problems in the prior art using the DFR in which the positive resist under the DFR is melted and a gap is formed with the DFR at the time of forming an anti-etching protective film of the side etched portion due to the insufficient masking ability, resulting in the loss of the function as an anti-etching protective layer. Also, the DFR is dissolved (expanded) and separated by the developer at the time of development of the positive resist, or the DFR is deformed under the pressure of the developer resulting in a lower adhesion of the DFR and separation leading to the loss of the masking function, is eliminated.

The invention claimed is:

1. A method of forming a metal plate pattern, comprising the steps of:
   forming a patterned first metal layer, material of which being different from that of a metal plate, on at least one of two surfaces of the metal plate;
   conducting selective half etching to the metal plate using the first metal plate layer as a first mask;
   coating a negative resist on the half etched surface from an upper portion of the first mask, and by exposure and development from the upper portion of the first mask, removing the unexposed soluble negative resist of the side etching layer formed under the first mask;
   forming a second metal layer as a second mask, material of which being different from that of the metal plate, on the side etched layer from which the negative resist has been removed;
   removing the negative resist exposed and set;
   selectively half etching the metal plate again through the first and second masks; and
   removing the first and second masks.

2. The method of forming a metal plate pattern according to claim 1, wherein the step of forming the patterned first metal layer includes a step of applying the resist on at least one of two surfaces of the metal plate and forming a resist pattern by patterning the resist, the step of forming the first metal layer by pattern plating at the portion of the resist pattern not masked, and a step of removing the resist.

3. The method of forming a metal plate pattern according to claim 1, further includes a step of applying the negative resist for exposure and development thereby to remove soluble negative resist of the side etched portion under the first mask, a step of forming the second metal layer as a second masks on the side etching layer, a step of removing the negative resist set and a step of selectively half etching to metal plate again through the first and second masks is repeated.

4. The method of forming a metal plate pattern according to claim 1, wherein the metal plate is formed of selected one of copper, iron and iron-nickel alloy soluble by an etching solution used, and wherein the first and second metal layers are both selected one of a tin plating layer, a solder plating layer and a silver plating layer not soluble in the etching solution.

5. The method of forming a metal plate pattern according to claim 1, wherein the resist coated on the metal plate is selected one of a dry film resist and a liquid resist, and the negative resist is selected one of a liquid negative resist and an electrodeposited negative resist.

6. The method of forming a metal plate pattern according to claim 1, further comprising the steps of:
dipping the metal plate pattern and a metal, wherein the metal is formed from a material that is different from that of the metal plate, in an electrolytic solution; and
applying a voltage between the metal plate pattern as a positive electrode and the metal as a negative electrode in the electrolytic solution and electrolytically polishing by preferentially eluting protrusions on a surface of the metal plate pattern.

7. The method of forming a metal plate pattern according to claim 1, further comprising the steps of:
dipping the metal plate pattern and a metal, wherein the metal is formed from a material that is the same as that of the metal plate, in an electrolytic solution; and
applying a voltage between the metal plate pattern as a positive electrode and the metal as a negative electrode in the electrolytic solution and electrolytically polishing by preferentially eluting protrusions on a surface of the metal plate pattern.

8. A method of forming a circuit board, comprising the steps of:
forming a patterned first metal layer, material of which being different from that of a metal foil, formed on at least one of two surfaces of an insulating base member;
conducting a selective half etching to the metal foil using the first metal layer as a first mask;
coating a negative resist on the half etched surface from an upper portion of the first mask, and by exposure and development from the upper portion of the first mask, removing the unexposed soluble negative resist of the side etched layer formed under the first mask;
forming a second metal layer as a second mask, material of which being different from that of the metal foil, on the side etched layer from which the negative resist has been removed;
removing the negative resist exposed and set;
selectively half etching the metal foil again through the first and second masks; and
removing the first and second masks.

9. A method of forming a circuit board according to claim 8, wherein the step of forming the patterned first metal layer includes a step of applying the resist on a metal foil formed on at least one of two surfaces of an insulating base member and forming a resist pattern by patterning the resist, the step of forming the first metal layer by pattern plating at the portion of the resist pattern not masked, and the step of removing the resist.

10. A method of forming a circuit board according to claim 8, further including a step of applying the negative resist for exposure and development thereby to remove the soluble negative resist of the side etched layer under the first mask, a step of forming the second metal layer as a second mask on the side etched layer, a step of removing the negative resist set and a step of selectively half etching the metal foil again through the first and second masks is repeated.

11. A method of forming a circuit board according to any one of claim 8, wherein the metal foil is formed of selected one of copper, iron and iron-nickel alloy soluble by an etching solution used, and wherein the metal plating layer is selected one of a tin plating layer, a solder plating layer and a silver plating layer not soluble in the etching solution.

12. A method of forming a circuit board according to claim 8, wherein the resist coated on the metal foil is selected one of a dry film resist and a liquid resist, and the negative resist is selected one of a liquid negative resist and an electrodeposited negative resist.

13. The method of forming a circuit board according to claim 8, further comprising the steps of:
dipping the circuit board and a metal, wherein the metal is formed from a material that is different from that of the metal foil forming the circuit board, in an electrolytic solution; and
applying a voltage between the circuit board as a positive electrode and the metal as a negative electrode in the electrolytic solution and electrolytically polishing by preferentially eluting protrusions on a surface of the circuit board.

14. The method of forming a circuit board according to claim 8, further comprising the steps of:
dipping the circuit board and a metal, wherein the metal is formed from a material that has the same type as that of the metal foil forming the circuit board, in an electrolytic solution; and
applying a voltage between the circuit board as a positive electrode and the metal as a negative electrode in the electrolytic solution and electrolytically polishing by preferentially eluting protrusions on a surface of the circuit board.

* * * * *